United States Patent [19]

Tsang et al.

[11] Patent Number: 4,690,728

[45] Date of Patent: Sep. 1, 1987

[54] PATTERN DELINEATION OF VERTICAL LOAD RESISTOR

[75] Inventors: Chi-Hwa Tsang; Galen Kawamoto, both of Beaverton; Leopoldo D. Yau, Portland, all of Oreg.

[73] Assignee: Intel Corporation, Santa Clara, Calif.

[21] Appl. No.: 922,289

[22] Filed: Oct. 23, 1986

[51] Int. Cl.$^4$ .................. H01L 21/306; B44C 1/22; C23F 1/02; C03C 15/00

[52] U.S. Cl. .................... 156/643; 29/610 R; 29/620; 156/646; 156/653; 156/657; 156/659.1; 156/662; 204/192.32; 338/308; 427/103

[58] Field of Search ............ 29/576 R, 576 W, 577 C, 29/580, 591, 610 R, 620; 204/192.32; 156/643, 646, 652, 653, 657, 659.1, 662; 427/38, 39, 102, 103; 338/308, 311; 252/79.1

[56] References Cited

U.S. PATENT DOCUMENTS

| | | | |
|---|---|---|---|
| 3,900,944 | 8/1975 | Fuller et al. | 156/656 X |
| 4,208,781 | 6/1980 | Rao et al. | 29/610 R |
| 4,341,594 | 7/1982 | Carlson et al. | 156/643 |
| 4,445,966 | 5/1984 | Carlson et al. | 156/643 |

FOREIGN PATENT DOCUMENTS

| | | |
|---|---|---|
| 0122659 | 10/1984 | European Pat. Off. . |
| 0165538 | 12/1985 | European Pat. Off. . |
| 58-50770 | 3/1983 | Japan . |
| 1488728 | 10/1977 | United Kingdom . |

OTHER PUBLICATIONS

Ghandhi, "VLSI Fabrication Principles", A Wiley-Interscience Publication 1983, pp. 427-429.
Adams, "VLSI Technology", 1983, McGraw Hill, pp. 120-123.

Primary Examiner—William A. Powell
Attorney, Agent, or Firm—Blakely, Sokoloff, Taylor & Zafman

[57] ABSTRACT

A process for delineating a vertical resistor on a semiconductor device is disclosed. Resistive and diffusion barrier layers are deposited and then etched, first by dry plasma and then by wet bath. The two step etching allows complete removal of the deposited layers with minimal damage to exposed dielectric, silicide, polysilicon or doped regions on the semiconductor.

30 Claims, 10 Drawing Figures

PATTERN DELINEATION OF VERTICAL LOAD RESISTOR

BACKGROUND OF THE INVENTION

1. Field of the Invention

This invention relates to the field of semiconductor device fabrication. Specifically, it applies to the field of patterning selected layers during the fabrication.

2. Prior Art

In the early years of metal oxide semiconductor (MOS) technology, resistance elements for integrated circuits were provided by diffused regions in the substrate, polysilicon members, and the like. These elements, which occupied relatively large areas in the circuit, are not as widely used with the advent of more complex circuitry which require higher densities and higher resistances.

The lack of adequate resistors for use in high density semiconductor integrated circuits (IC's) led to an avoidance of their use. Circuits were deliberately designed to use fewer resistors, and in many cases transistors were used in their place. The static memory cell, for instance, has traditionally been constructed as a six transistor bistable circuit in which two of the six transistors serve as load devices.

Recently, advances have been made in the use of vertical load resistors composed of silicon-rich silicon nitride type films. By applying the resistors vertically, area on the semiconductor wafer is conserved, making resistance elements feasible in complex high density circuitry. Unfortunately, prior art techniques for patterning silicon nitride or silicon films do not work well for patterning vertical resistors on high-density semiconductor devices.

As disclosed in the patent application entitled, *Plasma Enhanced Chemical Vapor Deposited Vertical Resistor;* Ser. No. 825,314; filed Feb. 3, 1986, and assigned to the assignee of the present invention, it is often desirable to layer vertical resistors over areas near shallow transistor junctions composed of N+ or P+ doped silicon, then to remove a layer from selected junctions, wherein leaving the layer over other areas. Prior art chemical vapor deposition (CVD) techniques do not damage these delicate shallow regions. However, dry plasma etching of the resistive layer can damage the shallow juntions because the etching is not sufficiently selective. The plasma begins etching the shallow junction before the resistive layer is completely removed. Wet etching also causes problems. First, photoresist will not survive an attack by available wet etch solutions, which can selectively etch the vertical load resistor over underlying dielectric or silicon layer. Second, other available wet etch solutions do not selectively etch vertical load resistors and also attack the underlying layers. Third, because wet etching does not work anisotropically, it tends to undercut exposed layers.

The present invention avoids all these problems. It is particularly useful in the fabrication of vertical load resistors for MOS static random access memory (SRAM) devices; however, it may be practiced in most any semiconductor device fabrication.

SUMMARY OF THE INVENTION

The present invention is a new process for patterning resistive layers on semiconductor wafers. A layer of resistive material is deposited on the wafer followed by a layer of diffusion barrier. A photoresist is applied and then masked. Dry plasma etching is used to remove the diffussion barrier and most of the resistive layer in the unmasked areas. After the photoresist mask is removed in a plasma etcher, wet etching then removes the remaining resistive layer. During wet etching, part of the diffussion barrier serves as a mask. In this manner, a resistive layer and a diffusion barrier layer are patterned on the wafer. The invention is particularly well suited to applications in which silicon, polysilicon, silicide and dielectric are exposed during the etching process. The two step dry plasma and wet etching completely etches the resistive and diffusion barrier layers quickly but without damage to exposed underlying areas.

DETAILED DESRIPTION OF THE INVENTION

The following detailed description is illustrative and not limitative. While many specific details are provided these details are not intended to limit the invention but only to show particular embodiments. It is under-stood that many variations in the method described below are possible without departing from the spirit or scope of the present invention. In addition, some components of the present invention are not fully disclosed as they are well known to those skilled in the art.

Figure 1:
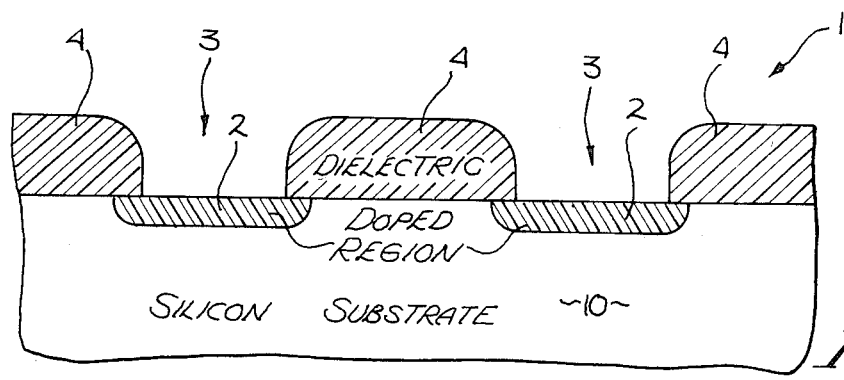
FIG. 1 is a cross-sectional elevation view of a portion of a silicon wafer which includes windows cut into a dielectric layer to expose doped regions.

In the preferred embodiment, the process of the present invention begins with a silicon wafer 1 as diagrammed in FIG. 1. The wafer 1, which includes a substrate 10, has doped regions 2. Doped regions 2 are formed by various prior art doping techniques, such as diffusion, to form various elements of a device, such as drain and source regions of a transistor. Because the doped regions are very shallow in high density circuits, typically 1000 to 2000 angstroms deep, they are very sensitive to overetching, as will be explained below. Above substrate 10 and regions 2 a dielectric layer 4 is fabricated and formed to have windows 3 cut into the dielectric layer 4 to expose portions of region 2. The dielectric layer 4 isolates the underlying layers from the layers deposited over it and also provides a smooth surface. The dielectric layer 4 may be of various prior art materials, such as oxides, but the preferred embodiment uses glass for dielectric layer 4, more specifically boro-silicate or boro-phosphosilicate glass.

Figure 2:
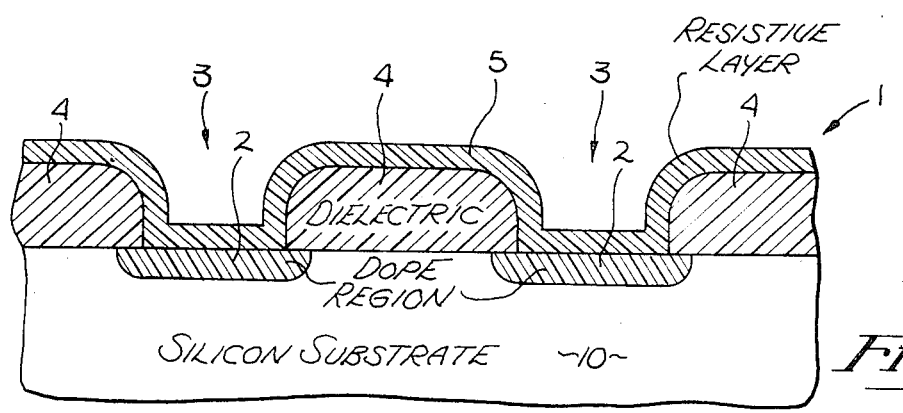
FIG. 2 illustrates the wafer of FIG. 1 after a resistive layer has been deposited.

Referring to FIG. 2, an electrically resistive material layer 5 is deposited over the dielectric layer 4 and regions 2. In the preferred embodiment, resistive layer 5 is comprised of silicon-rich silicon nitride of 2000 to 2500 angstroms thick. The nitride is deposited using plasma enhanced chemical vapor deposition (PECVD) as is well known in the art, although other well known methods may be used as well. Further, although resistive layer 5 is shown deposited over doped regions 2 and dielectric layer 4, various underlying layers can be used, such as silicon, polysilicon, polycide, and a silicon substrate, without departing from the spirit and scope of the invention.

Figure 3:
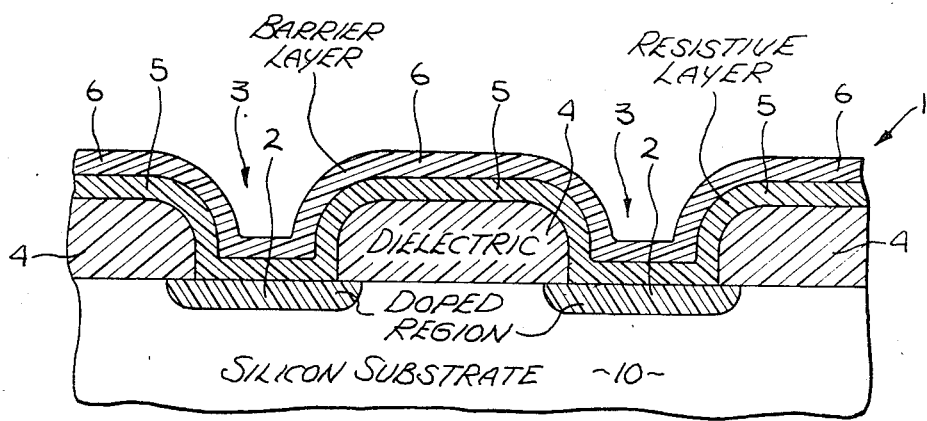
FIG. 3 illustrates the wafer of FIG. 2 after a diffusion barrier layer has been deposited.

Next, as shown in FIG. 3, a diffusion barrier layer 6, is deposited over the resistive layer 5. This barrier layer 6 acts to prevent a destructive reaction between resistive layer 5 and a layer, usually metal, which may be deposited subsequently. Further, it also acts as an etch mask during the wet etch as descibed below. In the preferred embodiment, a layer of titanium nitride 450 to 1500 angstroms thick is deposited with a reactive sputtering system as is well known in the art to form layer 6. However, any other material which functions as an effective diffusion barrier and which etches slower than or comparatively equivalent in the wet etch step as the electrically resistive layer 5 can be used.

Figure 4:
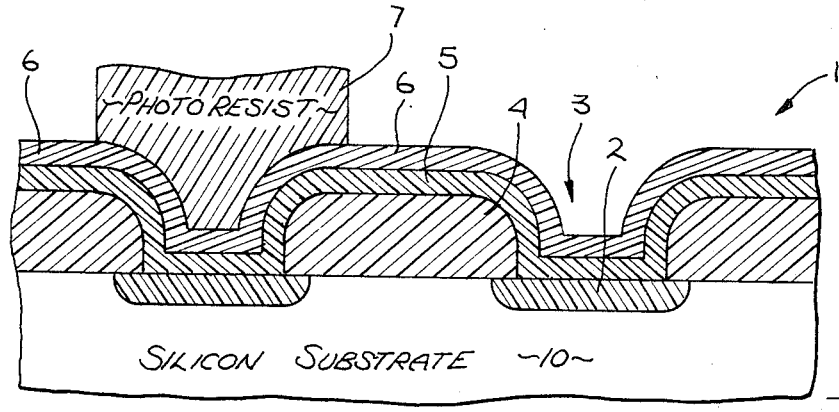
FIG. 4 illustrates the wafer of FIG. 3 after a photoresist layer has been formed.

Referring to FIG. 4, a layer 7 of commercially available photoresist is formed over the area where vertical resistors are desired. Layer 7 is patterned using photolithography which is well-known in the art. The wafer is then prepared for etching in a commercially available plasma etcher.

Figure 5:
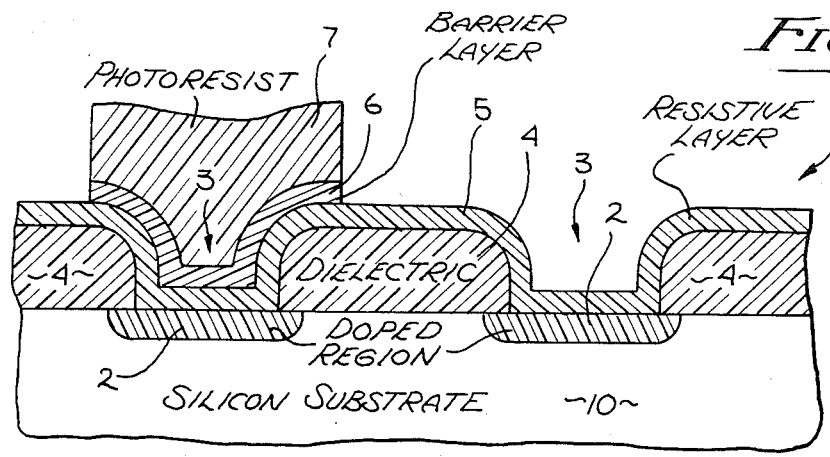
FIG. 5 illustrates the wafer of FIG. 4 after a first dry plasma etch.

The first etching step is a dry plasma etch. As shown in FIG. 5, this etch process etches unmasked portions of the barrier layer 6, but leaves substantially all of the resistive layer 5 intact. In the preferred embodiment, the electrode gap is set to 0.5-1.2 cm, the radio frequency power is set approximately to 250-350 watts and pressure to 300-500 millitorr. The plasma is comprised of $Cl_2$ circulated at 50-200 standard cubic centimeters per minute (sccm). Helium at 0-100 sccm is added to improve the uniformity.

Next, a second dry plasma etch is performed to remove unmasked portions of the resistive layer 5. It is during this step that the delicate shallow doped regions are threatened. While dry plasma etching works much more controllably than conventional wet etching, it is not sufficiently selective between doped silicon, polycide or dielectric and silicon-rich silicon nitrides, which is used in the preferred embodiment as the resistive layer 5.

Further, dry plasma etching does not etch uniformly. This is partially because the nitride film is not of uniform thickness or consistency and partially because the etching compounds are not evenly distributed in the plasma. Further, device topography prevents a uniform layer to form. The final result is that while much of the silicon-rich silicon nitride layer 5 may be removed in certain areas, residues may remain in others. If the etch is allowed to continue until all the undesired silicon-rich silicon nitride layer 5 is removed portions of the doped regions 2 will be exposed to the plasma, which will etch away portions of the doped regions 2. The etching of doped regions 2 is particularly troublesome in high density circuits where only 200-500 angstroms of silicon removal is allowed without degrading the juction integrity.

Figure 6:
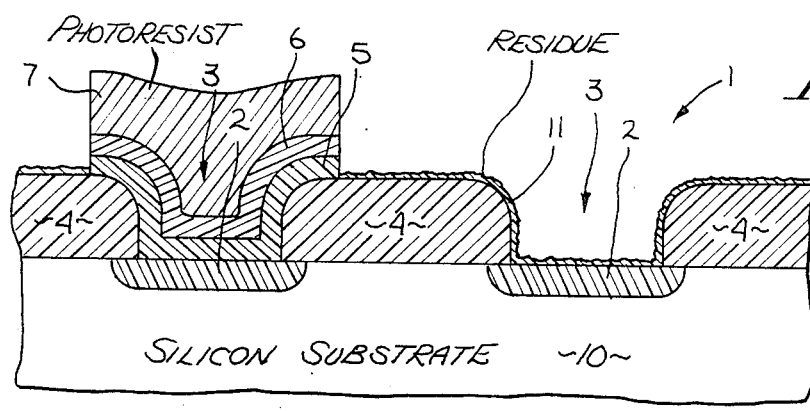
FIG. 6 illustrates the wafer of FIG. 5 after a second dry plasma etch.

In order to avoid etching the doped regions 2, the etcher is equipped with a conventional end point detection device. This device detects and signals when the silicon-rich silicon nitride has been etched completely anywhere on the wafer, thereby exposing the underlying layer. When this happens, the etching is stopped, leaving a residual resistive layer 11 as is shown in FIG. 6.

In the preferred embodiment, the second dry plasma etch is done in the same commercial plasma etcher as the first dry plasma etch step. In this step, $C_2F_6$ at 50-200 sccm is introduced in to the etcher as the plasma material. $O_2$ is added to increase the etch rate and helium of 0-100 sccm is added to obtain a uniform etching. The same electrode gap of 0.5-1.2 cm. is used with a pressure of 300-700 millitorr at a radio frequency power of 200-400 watts.

Figure 7:
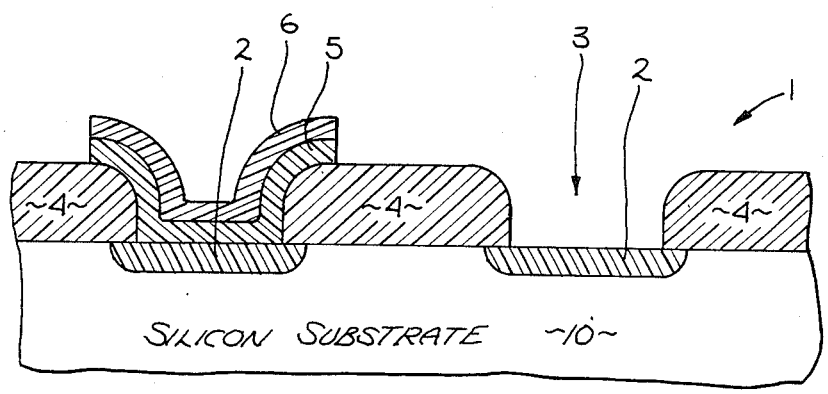
FIG. 7 illustrates the wafer of FIG. 6 after plasma stripping the photoresist and etching in a wet bath, showing the patterned vertical resistor and diffusion barrier.

The final etch is a wet etch. It is intended to remove any residual unmasked resistive material without damaging the underlying regions 2 and layer 4. As the photoresist is stripped, the formerly masked portions of the resistive layer 5 is still masked by the barrier layer 6. In the preferred embodiment, a hot phosphoric acid bath at temperatures greater than 150° C. is used. The acid is comprised of $H_3PO_4$ and deionized water which etches silicon-rich silicon nitride over the underlying layers. This etch removes all residual silicon-rich silicon nitride 11, typically in less than five minutes. The nitride layer 5 that is to become the resistor is effectively masked by the barrier layer 6. The preferred embodiment uses titanium nitride as barrier layer 6. Titanium nitride etches 1 to 3 times slower than silicon nitride in phosphoric acid permitting residue 11 to be removed while resistive layer 5 under titanium nitride 6 is still protected as is shown in FIG. 7.

Advantages of combining dry plasma etching with wet etching are significant when compared to dry or wet etching performed alone. Wet etching alone is capable of removing the undesired resistive material as well as the barrier layer material; however, the high temperature of the acid will melt or deform the resist. Most any suitable etchants will not perform functionally as desired at low temperatures.

Dry plasma etching process is more desirable in comparison to wet etching as far as manufacturing is concerned. However, due to the non-uniform layering, as well as to non-uniform etching, dry plasma etching will cause overetching in some regions if all of the undesired resistive material is to be removed. As explained above, when this overetching occurs in the doped regions of the substrate, device damage will occur. This damage is significant in shallower doped regions which are typically present in high-density semiconductor devices. Further, the present invention is performed relatively quickly, yet provides for high accuracy.

Figure 8:
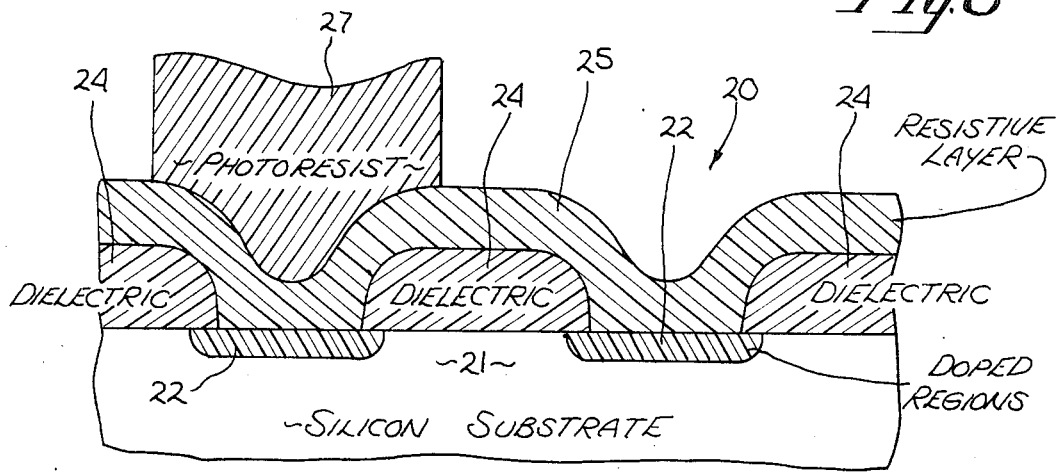
FIG. 8 is a cross-sectional elevation view of an alternative embodiment showing a portion of a silicon wafer which shows a formation of a photoresist layer over a resistive layer.
Figure 9:
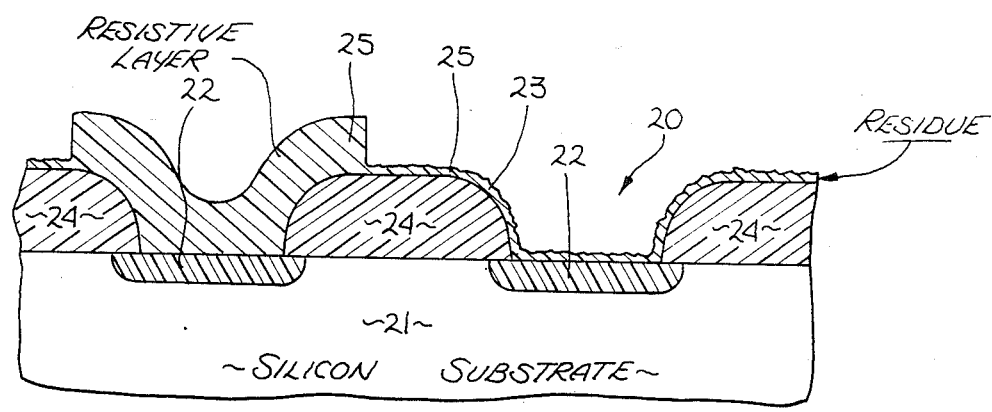
FIG. 9 illustrates the wafer of FIG. 10 after etching in dry plasma.
Figure 10:
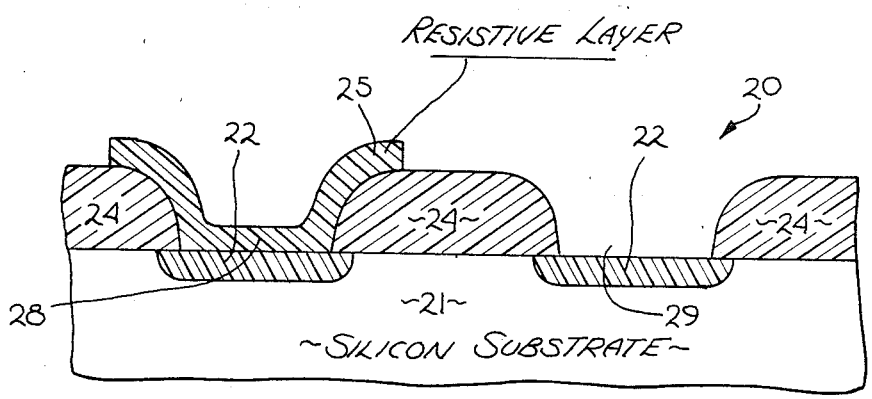
FIG. 10 illustrates the wafer of FIG. 11 after plasma stripping the photoresist and etching in a wet bath and showing a patterned vertical resistor.

Referring to FIGS. 8-10, a variation of the present invention is shown. The alternative embodiment is comprised of wafer 20 having a substrate 21, doped regions 22, dielectric layer 24 and resistive layer 25 and is constructed similarly to the device of FIGS. 1 and 2. However, a barrier layer is not used in the alternative embodiment. Instead, a photoresist material 27 is formed over an area where a vertical resistor is desired.

A plasma etching step similar to the second dry plasma etching step of the preferred embodiment is used to remove resistive material 25 from undesirable areas, but still leaving a residue 23 as was done with the preferred embodiment. The photoresist 22 is then stripped and the wafer goes into a wet etch bath. In the wet bath, the residual unmasked silicon-rich silicon nitride comprising layer 25 is removed as is some of the formerly masked silicon-rich silicon nitride. However, if the silicon-rich silicon nitride layer is sufficiently thick, silicon-rich silicon nitride will remain in the formerly masked regions but residue 23 will be removed after wet etching.

A final result is shown in FIG. 10, wherein a vertical resistor is formed over region 28 but region 29 is free of any resistive material. A diffusion barrier layer may still be formed in a later step if desired.

Although the preferred embodiment, as well as the alternative embodiment are described using specific materials, it is appreciated that various materials well-known in the prior art may be used as a substitute without departing from the spirit and scope of the invention. Therefore, a variety of barrier metals, such as titanium and titanium tungsten, may be substituted for titanium nitride and a variety of electrically resistive materials may be substituted for silicon-rich silicon nitride. Further, the dry etching gas $C_2F_6$ may be substituted by $CHF_3$ and $CF_4$ during either of the dry etching steps.

Thus a novel technique to pattern resistive layers on a semiconductor wafer is described.

We claim:

1. A process for patterning a resistive layer of a semiconductor device, comprising the steps of:
   depositing an electrically resistive layer;
   etching in dry plasma to remove an unmasked portion of said resistive layer;
   etching in a wet bath to remove remnants of said unmasked portion;
   whereby a vertical resistor is formed on said semiconductor device.

2. The process of claim 1, wherein said dry plasma is comprised of $C_2F_6$.

3. The process of claim 2, wherein said wet bath is comprised of $H_3PO_4$.

4. The process of claim 3, wherein said resistive layer is comprised of silicon-rich silicon nitride.

5. The process of claim 4, wherein said semiconductor device is formed on a silicon substrate.

6. The process of claim 5, further including the step of forming a barrier layer above said vertical resistor.

7. A process for patterning a resistor on a semiconductor device, comprising the steps of:
   depositing an electrically resistive layer;
   depositing a barrier layer on said resistive le, comprising the steps of:
   depositing an electrically resistive layer;
   depositing a barrier layer on said resistive layer;
   masking a portion of said resistive and barrier layers where said resistor is to be formed;
   etching in a first dry plasma etch cycle to remove an unmasked portion of said barrier layer;
   etching in a second dry plasma etch cycle to remove an unmasked portion of said resistive layer;
   etching in a wet bath to remove remnants of said unmasked portions;
   whereby a vertical resistor is formed on said semiconductor device.

8. The process of claim 7, wherein said first dry plasma etch cycle is comprised of a first plasma formed from chlorine.

9. The process of claim 8, wherein said second dry plasma etch cycle is comprised of a second plasma formed from $C_2F_6$.

10. The process of claim 9, wherein said wet bath is performed in $H_3PO_4$ and deionized water.

11. The process of claim 10, wherein said resistive layer is comprised of silicon-rich silicon nitride.

12. The process of claim 11, wherein said barrier layer is comprised of titanium nitride.

13. The process of claim 12, wherein said semiconductor device is formed on a silicon substrate.

14. The process of claim 13, wherein said second plasmas further including oxygen.

15. The process of claim 14, wherein said first and second plasma further including helium.

16. A process for patterning a resistor on a semiconductor device, comprising the steps of:
    depositing an electrically resisive layer on an underlying layer;
    depositing a barrier layer on said resistive layer;
    masking a portion of said resistive and barrier layers where said resistor is to be formed;
    etching in a first dry plasma etch cycle to remove an unmasked portion of said barrier layer;
    etching in a second dry plasma etch cycle to remove an unmasked portion of said resistive layer, but terminating said second dry plasma etch as soon as said underlying layer is exposed;
    etching in a wet bath to remove remnants of said unmasked portions;
    whereby a vertical resistor is formed on said semiconductor device.

17. The process of claim 16, wherein said first dry plasma etch cycle is comprised of a first plasma formed from $Cl_2$, circulated at 50–200 sccm at a pressure of 300–500 millitorr and having a radio frequency power at 250–350 watts.

18. The process of claim 17, wherein said first dry plasma etch cycle includes introducing helium at 0–100 sccm.

19. The process of claim 18, wherein said second dry plasma etch cycle is comprised of a second plasma formed from $C_2F_6$, circulated at 50–200 sccm at a pressure of 300–700 millitorr and having a radio frequency power of 200–400 watts.

20. The process of claim 19, wherein said wet bath is performed in $H_3PO_4$ and deionized water.

21. The process of claim 20, further including a step of forming a photoresistive layer on said barrier layer after depositing said barrier layer.

22. The process of claim 21, wherein said resistive layer is comprised of silicon-rich silicon nitride.

23. The process of claim 22, wherein said barrier layer is comprised of titanium nitride.

24. The process of claim 23, wherein said semiconductor device is formed on a silicon substrate.

25. The process of claim 24, wherein said underlying layer is a dielectric layer.

26. The process of claim 25, wherein said dielectric layer is glass.

27. The process of claim 26, wherein said first plasma further including helium and said second plasma further including oxygen and helium.

28. The process of claim 24, wherein said underlying layer is comprised of polysilicon.

29. The prociss of claim 24, wherein said underlying layer is comprised of polycide.

30. The process of claim 24, wherein said underlying layer is comprised of a silicon substrate.

* * * * *